(12) United States Patent
Kurosaki

(10) Patent No.: US 8,653,776 B2
(45) Date of Patent: Feb. 18, 2014

(54) INVERTER CONTROL DEVICE

(75) Inventor: Kei Kurosaki, Isesaki (JP)

(73) Assignee: Sanden Corporation, Gunma (JP)

( * ) Notice: Subject to any disclaimer, the term of this patent is extended or adjusted under 35 U.S.C. 154(b) by 253 days.

(21) Appl. No.: 13/375,201

(22) PCT Filed: May 28, 2010

(86) PCT No.: PCT/JP2010/059146
§ 371 (c)(1),
(2), (4) Date: Nov. 29, 2011

(87) PCT Pub. No.: WO2010/137708
PCT Pub. Date: Dec. 2, 2010

(65) Prior Publication Data
US 2012/0074889 A1    Mar. 29, 2012

(30) Foreign Application Priority Data
May 29, 2009    (JP) .................................. 2009-130288

(51) Int. Cl.
*H02P 7/00* (2006.01)
(52) U.S. Cl.
USPC ........................................................ 318/479
(58) Field of Classification Search
None
See application file for complete search history.

(56) References Cited

U.S. PATENT DOCUMENTS

2010/0134939 A1* 6/2010 Takahashi et al. ............... 361/87
2010/0156386 A1* 6/2010 Imura ............................ 323/313

FOREIGN PATENT DOCUMENTS

| JP | 07-072185 | 3/1995 |
|----|-----------|--------|
| JP | 08-266087 | 10/1996 |
| JP | 10-014098 | 1/1998 |
| JP | 2010-116024 | 5/2010 |

* cited by examiner

*Primary Examiner* — Lincoln Donovan
*Assistant Examiner* — Zoheb Imtiaz
(74) *Attorney, Agent, or Firm* — Cozen O'Connor

(57) ABSTRACT

Provided is an inverter control device that can detect momentary abnormality in a power-supply voltage for sure, and return quickly to regular state when the abnormality in the power-supply voltage has been settled. The inverter control device consists of a main power-supply (31); a sub power-supply (22) that converts electric power distributed from the main-power supply (31); a controller (21) that operates with a control power-supply supplied from the sub power-supply (22); a transistor (4) that makes the input signal of the controller (21) turn ON/OFF, by having the current between the emitter and collector made to turn ON/OFF; and a power-supply monitoring circuit (3) that is connected to the main power-supply (31) via at least a resistor ($r_D$), and monitors the voltage of the main power-supply (31). The emitter terminal of the transistor (4) is connected to the ground, the base terminal of the transistor (4) is connected to the output terminal of the power-supply monitoring circuit (3) via a resistor ($r_B$), and the current between the emitter and collector of the transistor (4) is made to be turned ON/OFF according to the output signal of the power-supply monitoring circuit (3).

8 Claims, 2 Drawing Sheets

INVERTER CONTROL DEVICE

RELATED APPLICATIONS

This is a U.S. National Phase Application under 35 USC §371 of International Application PCT/JP2010/059146 filed on May 28, 2010.

This application claims the priority of Japanese Patent Application No. 2009-130288 filed May 29, 2009, the entire content of which is hereby incorporated by reference.

TECHNICAL FIELD OF THE INVENTION

The present invention relates to an inverter control device having a power-supply monitoring circuit which can monitor a power-supply voltage appropriately.

BACKGROUND ART OF THE INVENTION

An inverter control device for electric compressors is provided with circuits, such as a power-supply monitoring circuit to detect a voltage reduction of a main power-supply at low-voltage side by a microcontroller placed at high-voltage side of a circuit of which low-voltage side is isolated from high-voltage side so that the control works well even when the voltage is unstable.

For example, Patent document 1 discloses a power-supply voltage monitoring circuit, wherein an input power-supply voltage is imported into a microcomputer, etc., at regular time intervals to be determined so that an outage program is executed by extending the reduction of voltage input to a calculating means by combining a predetermined calculating means, resistive elements and capacitors as detecting an instant outage without overlooking.

PRIOR ART DOCUMENTS

Patent Documents

Patent document 1: JP07-072185-A

SUMMARY OF THE INVENTION

Problems to be Solved by the Invention

Conventional power-supply monitoring circuits can be provided with a power-supply monitoring IC, etc., in order to detect an instant reduction of voltage of the main power-supply at low-voltage side. However, when the voltage input to the power-supply monitoring IC is lowered below the lower limit of operating voltage as blocking normal operation of the power-supply monitoring IC, high impedance, which shows that the power-supply is in a normal condition, may be wrongly outputted even when the power-supply voltage has been lowered abnormally. And when the microcontroller trusts such a wrong output, it is possible that malfunctions of various devices, such as a power semiconductor and a CAN transceiver operated by the sub power supply, are improperly detected by the reduction of the sub power-supply voltage, without proper detection of malfunctions of the power-supply. Once the microcontroller detects them improperly as such, the inverter control device sometimes incorrectly recognizes that a device without malfunctions is out of order, as working wrongly to interrupt CAN communication, for example.

In order to prevent such an abnormal operation, it is possible to use a power-supply voltage monitoring circuit as disclosed by Patent document 1. However, the power-supply voltage monitoring circuit disclosed in Patent document 1 is such that the time for voltage which has been lowered instantly to increase to recover is extended, so that the voltage reduction is easily detected to enter the outage program surely. Therefore, even if the voltage recovers into normal range after the instant power outage, the outage program progresses, so that it costs rather more time to recover into a steady state.

Accordingly, from a viewpoint of the above-described problems, an object of the present invention is to provide an inverter control device, which can firmly detect an instant malfunction of the power-supply voltage, and which can recover immediately into a steady state if the malfunction of the power-supply voltage is removed.

Means for Solving the Problems

To achieve the above-described object, an inverter control device according to the present invention is an inverter control device comprising:

a main power supply;
a sub power supply which converts an electric power distributed from the main power supply;
a controller which operates with an electric power for control supplied from the sub power supply;
a transistor which makes an input signal of the controller turn ON/OFF, by having a current between an emitter and a collector made to turn ON/OFF; and
a power-supply monitoring circuit of which input terminal is connected to the main power supply via at least a resistor ($r_D$) so as to monitor a voltage of the main power supply,
characterized in that an emitter terminal of the transistor is grounded, a base terminal of the transistor is connected to an output terminal of the power-supply monitoring circuit via a resistor ($r_B$), and the current between the emitter and the collector of the transistor is made to turn ON/OFF according to an output signal of the power-supply monitoring circuit.

Because the inverter control device employs such a circuit configuration having a controller operated with an electric power for control supplied from the sub power supply, a transistor which turns an input signal of the controller ON/OFF as a current between an emitter and a collector turns ON/OFF, and a power-supply monitoring circuit to monitor a voltage of the main power supply, the transistor immediately turns OFF the input signal of the controller to prevent the controller from wrongly detecting malfunction of devices, even in a case where abnormal reduction of voltage of the main power supply blocks normal function for monitoring voltage of the power-supply monitoring circuit so that abnormality of the main power supply cannot be detected by the power-supply monitoring circuit.

In the inverter control device according to the present invention, it is preferable that the output terminal of the power-supply monitoring circuit is connected to the main power supply via at least a resistance ($r_A$), that the input terminal of the power-supply monitoring circuit is grounded via an earth resistance ($r_E$), and that the base terminal of the transistor is grounded via a resistance ($r_C$). Such resistances $r_A, r_C, r_E$ make it possible to stabilize the operation of the power-supply monitoring circuit.

In the inverter control device according to the present invention, it is preferable that the output terminal of the power-supply monitoring circuit is connected to the main power supply via a diode and the resistance ($r_A$), that the input terminal of the power-supply monitoring circuit is connected to the main power supply via the diode, and that Formula 1 and Formula 2 are satisfied by a maximum value for a forward voltage ($V_{Fmax}$) of the diode, a minimum value for an operating voltage ($V_{MOV}$) of the power-supply monitoring circuit, a voltage ($V_{ST}$) of the main power supply when an input voltage of the power-supply monitoring circuit is equal to $V_{MOV}$, a minimum value for a voltage ($V_{BEmin}$) between a base and an emitter of the transistor, and electric resistance values ($R_A, R_B, R_C, R_D, R_E$) of resistances ($r_A, r_B, r_C, r_D, r_E$).

$$V_{ST} = V_{MOV} \times (R_D + R_E)/R_E + V_{Fmax} \quad \text{Formula 1:}$$

$$(V_{ST} - V_{Fmax}) \times R_C/(R_A + R_B + R_C) < V_{BEmin} \quad \text{Formula 2:}$$

Thus, when resistances $r_A$-$r_E$ have electric resistance values $R_A$-$R_E$ which satisfy the relational formulas 1 and 2, the controller can be prevented from wrongly detecting malfunction of devices even in a case where the power-supply monitoring supply voltage is abnormally lowered because the transistor becomes OFF when the input voltage of the power-supply monitoring circuit becomes less than the minimum operating voltage ($V_{MOV}$).

In addition, it is preferable to design the circuit as considering characteristic unevenness of various component parts configuring the circuit in the inverter control device of the present invention. Specifically, the circuit is preferably configured, such that minimum values within error of electric resistance values for $R_A, R_B, R_E$ satisfy relational Formulas 1 and 2 and that maximum values within error of electric resistance for $R_C, R_D$ satisfy relational Formulas 1 and 2.

In the inverter control device according to the present invention, it is preferable that any of Formulas 3-5 are satisfied by the maximum value for the forward voltage ($V_{Fmax}$) of the diode, a threshold voltage ($V_{TH}$) of the power-supply monitoring circuit, a voltage ($V_A$) of the main power supply when the input voltage of the power-supply monitoring circuit is equal to $V_{TH}$, a minimum value for a base current of ($I_{Bmin}$) of the transistor, a direct current amplification factor ($h_{FE}$) of the transistor, a maximum value for a collector current of the transistor ($I_{Cmax}$), a maximum value for a voltage ($V_{BEmax}$) between the base and the emitter of the transistor, and the electric resistance values ($R_A, R_B, R_C, R_D, R_E$) of the resistances ($r_A, r_B, r_C, r_D, r_E$).

$$V_A = V_{TH} \times (R_D + R_E)/R_E + V_{Fmax} \quad \text{Formula 3:}$$

$$I_{Bmin} = (V_A - V_{Fmax} - V_{BEmax})/(R_A + R_B) - V_{BEmax}/R_C \quad \text{Formula 4:}$$

$$I_{Bmin} \times h_{FE} > I_{Cmax} \quad \text{Formula 5:}$$

Thus, if the resistances $r_A$-$r_C$ have the electric resistance values $R_A$-$R_C$ to even satisfy the relational Formulas 3-5, the voltage of the main power supply decreases and then recovers into a normal range of voltage, and the input voltage of the power-supply monitoring circuit becomes above the threshold voltage ($V_{TH}$), so that the transistor recovers to ON-state. Thus in the inverter control device, it is possible to configure a circuit where the inverter control device immediately recovers into a steady state once the abnormal voltage range of the main power supply is dissolved.

In addition, it is preferable to design the circuit as considering characteristic unevenness of various component parts configuring the circuit in the inverter control device of the present invention. Specifically, the circuit is preferably configured, such that maximum values within error of electric resistance values for $R_A, R_B$ satisfy relational Formula 4, that minimum values within error of electric resistance values for $R_C, V_A$ satisfy relational Formula 4 and that minimum value within error of electric resistance value for $h_{FE}$ satisfies relational Formula 5.

In the inverter control device according to the present invention, it is preferable that the power-supply monitoring circuit comprises a power-supply monitoring integrated circuit. Thus, the inverter control device can be downsized by employing the integrated circuit (IC) which incorporates a power-supply monitoring circuit.

In addition, the circuit is preferably configured such that the transistor turns ON/OFF the input signal of the controller via a photocoupler which is provided as crossing an insulation border, in a case where the inverter control device according to the present invention has an insulation border across which the transistor turns ON/OFF the input signal of the controller. For example, it is preferable that the transistor turns ON/OFF the input signal inputted into the controller via the photocoupler in the inverter control device according to the present invention, which has a high-voltage side circuit and a low-voltage side circuit, and is provided with an insulation border between the high-voltage side circuit and the low-voltage side circuit.

In addition, the inverter control device is suitably used for controlling an electric compressor, and specifically, is suitably used as an inverter control device of an electric compressor for vehicles. The inverter control device according to the present invention, which has a power-supply monitoring function capable of operating simply and speedy, can be advantageously employed as an inverter control device to control an electric compressor for vehicles, such as electric vehicles and hybrid vehicles, because such inverter control devices are often mounted in a narrower space inside vehicles and their high-voltage side circuit and low-voltage side circuit are isolated by the insulation border. Also, such inverter control devices tend to fluctuate in their power-supply voltage.

In addition, the inverter control device according to the present invention is suitably used generally for a product, such as inverters for driving wheels, EPS (electric power steering mechanism) DC-DC converter, ECU (engine control unit) for controlling batteries, for vehicles, the product being provided with an insulation border inside the inverter control device.

Effect According to the Invention

The inverter control device according to the present invention can achieve the control to properly detect voltage reduction of the main power supply without wrongly detecting malfunction of devices which actually operates well even when the voltage of the main power supply decreases. When the inverter control device according to the present invention is used to control an electric compressor for vehicles, the CAN communication is prevented from being disturbed by sending an error frame by mistake, without notifying a driver of wrong information as sending incorrect warning information, such as information of malfunction of devices inside the inverter, to vehicle side ECU (engine control unit).

EMBODIMENTS FOR CARRYING OUT THE INVENTION

Figure 1:
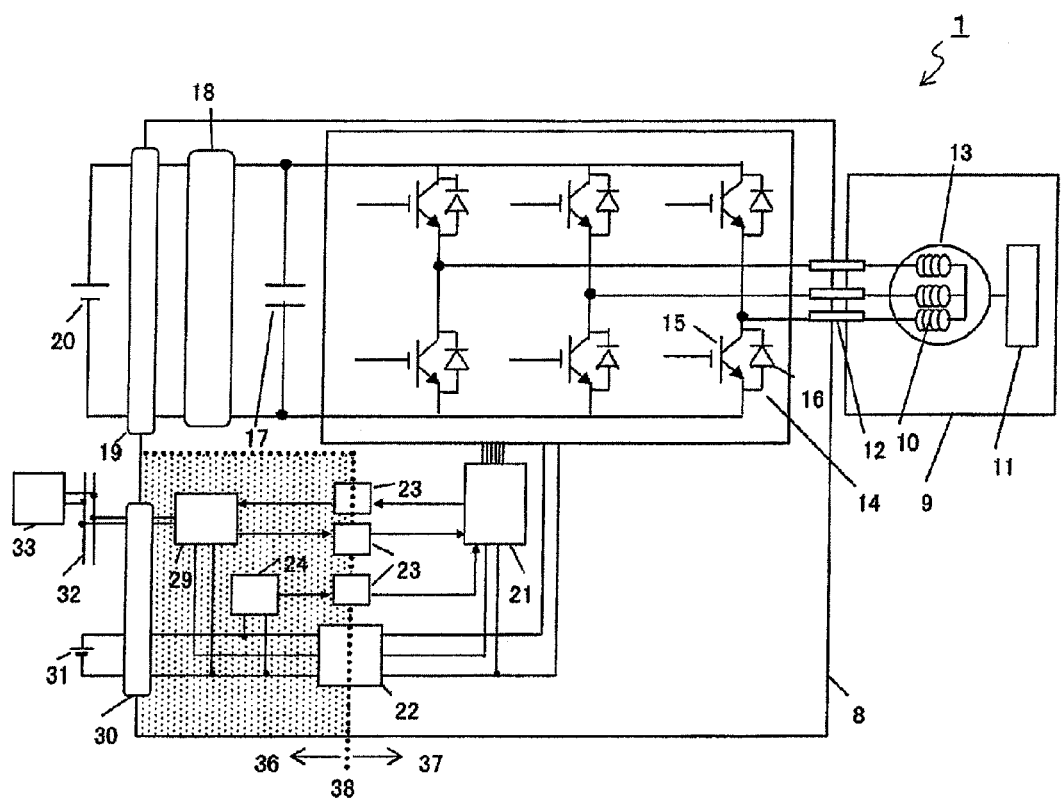
FIG. 1 is a schematic wiring diagram of an electric compressor employing an inverter control device according to an embodiment of the present invention.

Hereinafter, desirable embodiments will be explained as referring to figures. FIG. 1 is a schematic wiring diagram of an electric compressor employing an inverter control device according to an embodiment of the present invention. Electric compressor 1 can be roughly sectioned into drive circuit 8 and compressor 9. Drive circuit 8 is connected with high-voltage side battery 20 via connector 19, low-voltage side battery (LV12V power supply) 31 via a connector for control signal, in-car LAN 32 and vehicle-side ECU (engine control unit) 33. In the present invention, an inverter control device means a part including drive circuit 8, high-voltage side battery 20 and low-voltage side battery 31 among them.

In FIG. 1, compressor 9 comprises compression section 11, motor 13 having motor coil 10, and seal terminal 12 which is provided at a connecting part between compressor 9 and drive circuit 8. Seal terminal 12 is connected to power semiconductor element 14 in drive circuit 8. Power semiconductor element 14 comprises IGBT (insulation-gate bipolar transistor) 15 and free wheel diode 16, while being supplied with electric power via connector 19 from high-voltage side battery 20. Power semiconductor element 14 is stabilized by smoothing capacitor 17 and noise filter 18, consisting of a coil and a capacitor, which are connected in parallel to power semiconductor element 14.

Power semiconductor element 14 is controlled by microcontroller 21. Microcontroller 21 is made to be able to communicate to CAN transceiver 29 provided at low-voltage side via insulation element (photocoupler) 23. Microcontroller 21 is supplied with control electric power from insulation transformer power-supply circuit 22 as a high-voltage side sub power supply, which converts electricity distributed from low-voltage side battery 31 as a main power supply. Besides, microcontroller 21 is subjected to ON/OFF control with power-supply monitoring section (LV12V voltage-detecting circuit) 24 which is provided at low-voltage side.

Figure 2:
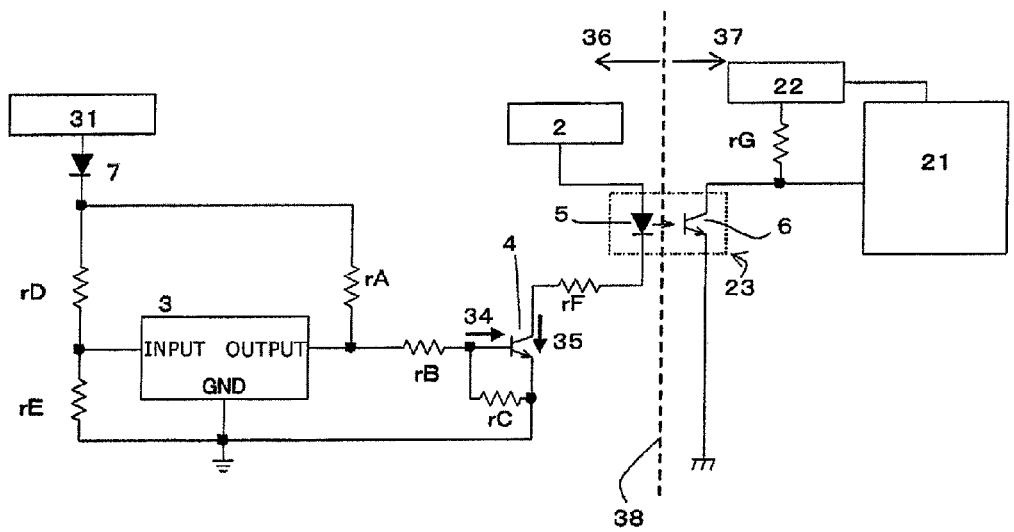
FIG. 2 a circuit diagram of a main section related to a power-supply monitoring function of an inverter control device according to an embodiment of the present invention.

FIG. 2 is a circuit diagram showing a main section related to a power-supply monitoring function of an inverter control device according to an embodiment of the present invention, corresponding to a part of FIG. 1, consisting of microcontroller 21, insulation transformer power-supply circuit 22, insulation element 23, power-supply monitoring section 24 and low-voltage side battery 31.

In FIG. 2, the input terminal of power-supply monitoring IC 3 is connected to the output terminal of low-voltage side battery 31 via diode 7 and resistance $r_D$, and is grounded via resistance $r_E$. Besides, the output terminal of power-supply monitoring IC 3 is connected to the output terminal of low-voltage side battery via diode 7 and resistance $r_A$, and is also connected to the base terminal of transistor 4 via resistance $r_B$. The emitter terminal of transistor 4 is grounded and is connected to the base terminal of transistor 4 via resistance $r_C$. The collector terminal of transistor 4 is connected to the output terminal of low-voltage side sub power supply (LV5V power supply) 2 via light emitting diode 5 as a light emitting element of insulation element 23, while the ON/OFF of the collector current from low-voltage side sub power supply 2 switches ON/OFF the electric current flowing to phototransistor 6 as a light receiving element of insulation element 23. As to microcontroller 21 which is provided in high-voltage side circuit 37, the positive power input terminal is connected to the positive output terminal of insulation transformer power-supply circuit 22 and the negative power input terminal is connected to the collector terminal of phototransistor 6. Also, the positive power input terminal of microcontroller 21 is connected to the negative power input terminal of microcontroller 21 via resistance $r_G$. Besides, the emitter terminal of phototransistor 6 is grounded.

Such a circuit as shown in FIG. 2 makes it possible to utilize the input signal of microcontroller 21 via insulation element 23 as a signal which shows voltage reduction, because base current ($I_B$) and voltage ($V_{BE}$) between base and emitter become zero (which is because low-voltage side sub power supply 2 has been configured to hold the voltage while electricity is interrupted for a moment) when the output voltage of low-voltage side battery 31 instantly becomes zero.

In addition, it might be possible that the output voltage of low-voltage side battery 31 abnormally decreases without reaching zero. Therefore it is desirable to design a circuit where electrical resistance levels ($R_A, R_B, R_C, R_D, R_E$) of resistances ($r_A, r_B, r_C, r_D, r_E$) meet all the following relational Formulas 1-5, in order to withstand such troubles.

$$V_{ST} = V_{MOV} \times (R_D + R_E)/R_E + V_{Fmax} \qquad \text{Formula 1:}$$

$$(V_{ST} - V_{Fmax}) \times R_C/(R_A + R_B + R_C) < V_{BEmin} \qquad \text{Formula 2:}$$

$$V_A = V_{TH} \times (R_D + R_E)/R_E + V_{Fmax} \qquad \text{Formula 3:}$$

$$I_{Bmin}(V_A - V_{Fmax} - V_{BEmax})/(R_A + R_B) - V_{BEmax}/R_C \qquad \text{Formula 4:}$$

$$I_{Bmin} \times h_{FE} > I_{Cmax} \qquad \text{Formula 5:}$$

Here, meanings of symbols in relational Formulas 1-5 are as follows.

$V_{TH}$: threshold voltage of power-supply monitoring IC
$V_A$: output voltage of low-voltage side battery when input voltage of power-supply monitoring IC is equal to $V_{TH}$
$V_{Fmax}$: maximum value for forward voltage of diode
$h_{FE}$: direct current amplification factor of transistor
$I_{Bmin}$: minimum value for base current of transistor
$I_{Cmax}$: maximum value for collector current of transistor
$V_{BEmin}$: minimum value for voltage between base and emitter of transistor
$V_{BEmax}$: maximum value for voltage between base and emitter of transistor
$V_{MOV}$: minimum operating voltage of power-supply monitoring IC
$V_{ST}$: output voltage of low-voltage side battery when input voltage of power-supply monitoring IC is equal to $V_{MOV}$
$R_A$: electric resistance value of resistance $r_A$
$R_B$: electric resistance value of resistance $r_B$
$R_C$: electric resistance value of resistance $r_C$
$R_D$: electric resistance value of resistance $r_D$
$R_E$: electric resistance value of resistance $r_E$ In addition, it is preferable to design the circuit as considering characteristic unevenness of various component parts configuring the circuit in the inverter control device according to this embodiment. Specifically, the circuit is preferably configured, such that minimum values within error of electric resistance for $R_A, R_B, R_E$ satisfy relational Formulas 1 and 2 and that values within error of electric resistance for $R_C, R_D$ satisfy relational Formulas 1 and 2. Further, the circuit is preferably configured, such that maximum values within error of electric resistance for $R_A, R_B$ satisfy relational Formula 4, that minimum values within error of electric resistance for $R_C, V_A$ satisfy relational Formula 4 and that minimum value within error of electric resistance for $h_{FE}$ satisfies relational Formula 5.

Figure 3:
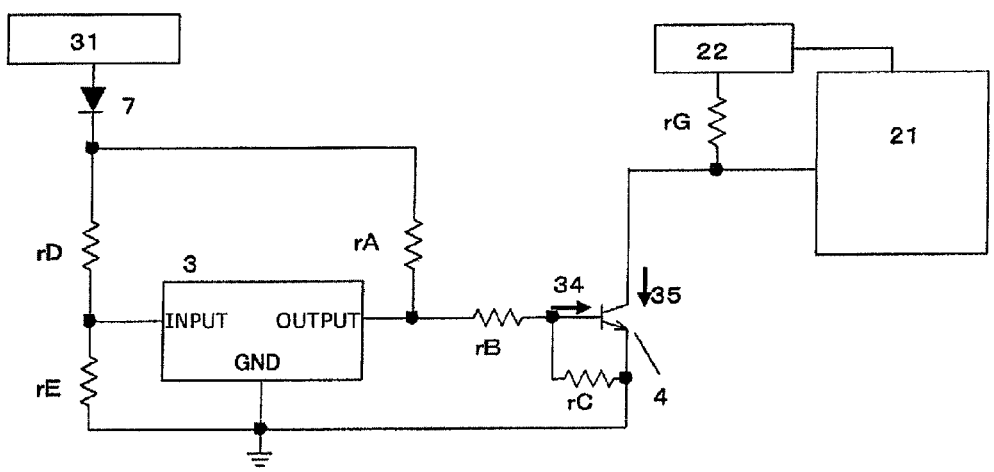
FIG. 3 is a circuit diagram of a main section related to a power-supply monitoring function of an inverter control device according to another embodiment of the present invention.

FIG. 3 shows a main section related to a power-supply monitoring function of an inverter control device according to another embodiment of the present invention. In FIG. 3, since basic principle and operation are the same as in FIG. 2, explanations will be omitted by giving the same symbols to corresponding parts.

The difference between FIG. 3 and FIG. 2 is that insulation border 38, which exists in FIG. 2, does not exist in FIG. 3. Since insulation border 38 does not exist, insulation transformer power-supply circuit 22 and insulation element 23 in FIG. 2 is not in FIG. 3. Further, microcontroller 21 is supplied with electric power for control from low-voltage sub power supply in place of insulation transformer power-supply circuit 22 in FIG. 2. Furthermore, resistance $r_F$ has been omitted.

Also in the inverter control device shown in FIG. 3, the input signal of microcontroller 21 can be utilized as a signal which shows voltage reduction when the output voltage of low-voltage side battery 31 instantly becomes zero, as in FIG. 2. Further, in order to withstand such a trouble where the output voltage of low-voltage side battery 31 abnormally decreases without reaching zero, relational Formulas 1-5 referred to in the case of FIG. 2 can be used to design electrical resistance levels ($R_A, R_B, R_C, R_D, R_E$) of resistances ($r_A, r_B, r_C, r_D, r_E$).

INDUSTRIAL APPLICATIONS OF THE INVENTION

An inverter control device according to the present invention is applicable to various devices which is required to properly control against abnormal voltage reduction of a main power supply. Specifically, it is suitable for controlling electric compressor for vehicles, etc.

EXPLANATION OF SYMBOLS

1: electric compressor
2: low-voltage side sub power supply
3: power-supply monitoring IC
4: transistor
5: light emitting diode
6: phototransistor
7: diode
8: drive circuit
9: compressor
10: motor coil
11: compression section
12: seal terminal
13: motor
14: power semiconductor element
15: IGBT
16: free wheel diode
17: smoothing capacitor
18: noise filter
19: connector
20: high-voltage side battery
21: microcontroller
22: insulation transformer power-supply circuit (high-voltage side sub power supply)
23: insulation element
24: power-supply monitoring section
29: CAN transceiver
30: connector for control signal
31: low-voltage side battery
32: in-car LAN
33: vehicle-side ECU
34: base current $I_B$
35: collector current $I_C$
36: low-voltage side circuit
37: high-voltage side circuit
38: insulation border
$r_A, r_B, r_C, r_D, r_E, r_F, r_G$: resistance

The invention claimed is:

1. An inverter control device, comprising:
a main power supply;
a sub power supply which converts an electric power distributed from said main power supply;
a controller which operates with an electric power for control supplied from said sub power supply;
a transistor which makes an input signal of said controller turn ON/OFF, by having a current between an emitter and a collector made to turn ON/OFF; and
a power-supply monitoring circuit of which input terminal is connected to said main power supply via at least a resistor ($r_D$) so as to monitor a voltage of said main power supply,
characterized in that an emitter terminal of said transistor is grounded, a base terminal of said transistor is connected to an output terminal of said power-supply monitoring circuit via a resistor ($r_B$), and said current between said emitter and said collector of said transistor is made to turn ON/OFF according to an output signal of said power-supply monitoring circuit.

2. The inverter control device according to claim 1, wherein said output terminal of said power-supply monitoring circuit is connected to said main power supply via at least a resistance ($r_A$), that said input terminal of said power-supply monitoring circuit is grounded via an earth resistance ($r_E$), and that said base terminal of said transistor is grounded via a resistance ($r_C$).

3. The inverter control device according to claim 2, wherein said output terminal of said power-supply monitoring circuit is connected to said main power supply via a diode and said resistance ($r_A$), said input terminal of said power-supply monitoring circuit is connected to said main power supply via said diode, and Formula 1 and Formula 2 are satisfied by a maximum value for a forward voltage ($V_{Fmax}$) of said diode, a minimum value for an operating voltage ($V_{MOV}$) of said power-supply monitoring circuit, a voltage ($V_{ST}$) of said main power supply when an input voltage of said power-supply monitoring circuit is equal to $V_{MOV}$, a minimum value for a voltage ($V_{BEmin}$) between a base and an emitter of said transistor, and electric resistance values ($R_A, R_B, R_C, R_D, R_E$) of resistances ($r_A, r_B, r_C, r_D, r_E$).

$$V_{ST}=V_{MOV}\times(R_D+R_E)/R_E+V_{Fmax} \quad \text{Formula 1:}$$

$$(V_{ST}-V_{Fmax})\times R_C/(R_A+R_B+R_C)<V_{BEmin.} \quad \text{Formula 2:}$$

4. The inverter control device according to claim 3, wherein any of Formulas 3-5 are satisfied by said maximum value for said forward voltage ($V_{Fmax}$) of said diode, a threshold voltage ($V_{TH}$) of said power-supply monitoring circuit, a voltage ($V_A$) of said main power supply when said input voltage of said power-supply monitoring circuit is equal to $V_{TH}$, a minimum value for a base current ($I_{Bmin}$) of said transistor, a direct current amplification factor ($h_{FE}$) of said transistor, a maximum value for a collector current of said transistor ($I_{Cmax}$), a maximum value for a voltage ($V_{BEmax}$) between said base and said emitter of said transistor, and said electric resistance values ($R_A, R_B, R_C, R_D, R_E$) of said resistances ($r_A, r_B, r_C, r_D, r_E$)

$$V_A=V_{TH}\times(R_D+R_E)/R_E+V_{Fmax} \quad \text{Formula 3:}$$

$$I_{Bmin}=(V_A-V_{Fmax}-V_{BEmax})/(R_A+R_B)-V_{BEmax}/R_C \quad \text{Formula 4:}$$

$$I_{Bmin}\times h_{FE}>I_{Cmax.} \quad \text{Formula 5:}$$

5. The inverter control device according to claim 1, wherein said power-supply monitoring circuit comprises a power-supply monitoring integrated circuit.

6. The inverter control device according to claim 1, wherein said transistor turns ON/OFF said input signal of said controller via a photocoupler which is provided as crossing an insulation border.

7. The inverter control device according to claim 1, wherein said control device controls an electric compressor.

8. The inverter control device according to claim 7, wherein said control device controls an electric compressor for vehicles.

\* \* \* \* \*